(12) United States Patent
Park et al.

(10) Patent No.: US 7,274,583 B2
(45) Date of Patent: Sep. 25, 2007

(54) MEMORY SYSTEM HAVING MULTI-TERMINATED MULTI-DROP BUS

(75) Inventors: Hong June Park, Kyungbuk (KR); Seung Jun Bae, Kyungbuk (KR)

(73) Assignee: Postech (KR)

( * ) Notice: Subject to any disclaimer, the term of this patent is extended or adjusted under 35 U.S.C. 154(b) by 155 days.

(21) Appl. No.: 11/142,873

(22) Filed: Jun. 1, 2005

(65) Prior Publication Data
US 2006/0146627 A1 Jul. 6, 2006

(30) Foreign Application Priority Data
Dec. 31, 2004 (KR) ............. 10-2004-0118264

(51) Int. Cl.
*G11C 5/06* (2006.01)
(52) U.S. Cl. ................. 365/63; 365/198; 365/51
(58) Field of Classification Search ............. 365/63, 365/198, 230.03, 51, 148
See application file for complete search history.

(56) References Cited

U.S. PATENT DOCUMENTS 6,744,332 B2 * 6/2004 Bois et al. ............ 333/125
6,754,132 B2 * 6/2004 Kyung ................... 365/233
6,930,904 B2 * 8/2005 Wu ......................... 365/72

* cited by examiner

*Primary Examiner*—Anh Phung
*Assistant Examiner*—Dang Nguyen
(74) *Attorney, Agent, or Firm*—Cantor Colburn LLP

(57) ABSTRACT

Provided is a memory system having a multi-drop bus structure. The memory system includes a bus, a memory controller in which a port connected to the bus is terminated by a resistor having a first impedance value, a connector connected to a point having the first impedance value from the memory controller on a bus line, and a memory module connected to the connector. The memory module includes a first load connected to the connector and having the first impedance value, a second load connected to the first load and having a second impedance value, a first chip in which a port connected to the second load is terminated by a resistor having the second impedance value, a via hole penetrating a printed circuit board of the memory module between the first load and the second load, a third load connected to the via hole and having the second impedance value, and a second chip in which a port connected to the third load is terminated by a resistor having the second impedance value. The first load, the second load, and a first chip are formed on a first surface of the memory module while the third load and the second chip are formed on a second surface thereof.

7 Claims, 7 Drawing Sheets

FIG. 3

| Configuration | | For Write | | | | For Read | | | |
|---|---|---|---|---|---|---|---|---|---|
| DIMM1 | DIMM2 | Write to | DIMM1 | DIMM2 | Controller | Read From | DIMM1 | DIMM2 | Controller |
| Present | Present | DIMM1 | OFF | ON | OFF | DIMM1 | OFF | ON | ON |
| | | DIMM2 | ON | OFF | OFF | DIMM2 | ON | | ON |
| Present | Empty | DIMM1 | ON | | OFF | DIMM1 | OFF | OFF | ON |
| Empty | Present | DIMM2 | | ON | OFF | DIMM2 | | OFF | ON |

MEMORY SYSTEM HAVING MULTI-TERMINATED MULTI-DROP BUS

BACKGROUND OF THE INVENTION

1. Field of the Invention

The present invention relates to a semiconductor memory system, and more particularly, to a memory module having a multi-drop bus structure having multiple termination resistors, and to a memory system having the same.

2. Description of the Related Art

A DRAM uses a multi-drop method in which a plurality of chips are simultaneously connected to a single channel to increase data capacity in a data transmission method. According to the channel in the multi-drop method, as shown in FIG. 1, a plurality of chips 120 through 130 are connected to a single signal line 100. A T-shaped connection portion where lines are connected in three directions exists on the signal line 100 connected to the chips 120 through 130. When data is transmitted, a reflected wave is generated because impedance of the signal line 100 varies at the T-shaped connection portion. Since the reflected wave is generated at each of nodes where the chips 120 through 130 are connected, the total amount of the reflected waves increases as the number of chips connected to a single signal line increases. The reflected wave has a great influence on a transmitted signal as a data transmission speed increases so that the transmission speed of data is limited.

FIG. 2 is a view illustrating a configuration of a bus used for a DDR-II memory system. Referring to FIG. 2, in a DDR-II memory system 200, a DRAM controller 210 and dual in-line memory modules (DIMM) 230 and 260 are connected to a single bus line 220. The DDR-II memory system 200, unlike an SSTL bus used for a DDR SDRAM, has termination resistors 211, 212, 241, 242, 271, and 272 which are arranged in the DRAM controller 210 and the DRAMs 240, 250, 270, and 280. These termination resistors 211, 212, 241, 242, 271, and 272 are referred to as on-die termination (hereinafter, referred to as "ODT"). The ODT resistors 211, 212, 241, 242, 271, and 272 reduce influence generated due to loads by parasite capacitance and inductance existing in the DRAM chips 240, 250, 270, and 280 to improve preservation of a signal, compared to the SSTL bus.

For the maximum signal preservation on the bus line 220, the ODT resistors 211, 212, 241, 242, 271, and 272 are controlled as shown in FIG. 3. in FIG. 3, "Write" signifies storing data on the DRAMs 240, 250, 270, and 280 while "Read" signifies reading data from the DRAMs 240, 250, 270, and 280. During a write operation, when data is stored on a DRAM1 240, for example, the ODT resistors 271 and 272 existing on the DIMM2 260 are turned on while the ODT resistors 241 and 242 existing on the DIMM1 230 are turned off. In this case, the reflected wave is continuously generated from the DIMM2 (260) so that influence on the DIMM1 230 is prevented. Meanwhile, when the data is stored in the DRAM3 chip 270, the ODT resistors 241 and 242 of the DIMM1 230 are turned on while the ODT resistors 271 and 272 of the DIMM2 260 are turned off. Thus, the reflected wave is continuously generated from the DIMM1 230 so that influence on the DIMM2 260 is prevented.

During a read operation, the ODT resistors 211 and 212 of the DRAM controller 210 are turned on. When the data is read from the DRAM1 240, the ODT resistors 271 and 272 of the DIMM2 260 are turned on while the ODT resistors 241 and 242 of the DIMM1 230 are turned off. In contrast, when the data is read from the DRAM3 270, the ODT resistors 241 and 242 of the DIMM1 230 are turned on while the ODT resistors 271 and 272 of the DIMM2 260 are turned off.

Although the bus line 220 of the DDRII memory system 200 enables data transmission at an operation speed less than 1 Gb/s, the data transmission at a speed higher than 1 Gb/s is limited because the influence by the reflected wave increases. Even when the ODT resistors 211, 212, 241, 242, 271, and 272 are on, reflection is continuously generated at a lot of the T-shaped connection portions. That is, considering that the data is stored on the DRAM1 240, since the ODT resistors 271 and 272 of the DIMM2 260 are terminated, the reflected wave is not generated from the DIMM2 260. In the DIMM1 230, however, since input nodes of the DRAM chips 240 and 250 are open, the reflected wave is generated. The reflected wave generated from the DIMM1 230 passes through a connector of the DIMM1 230 again. Since the connector is the T-shaped connection portion, the reflected wave is regenerated and works as a signal interference ISI in storing data in the DRAM1 240 so that the signal preservation is deteriorated. Also, the signal among the reflected wave generated from the DIMM1 230 which proceeds toward the DRAM controller 210 regenerates the reflected wave so as to influence the DRAM1 240 as the ISI.

In the operation of storing or reading data with respect to the DRAMs 270 and 280 in the DIMM2 260, the reflected wave by the ODT resistors 271 and 272 which are in an "OFF" state influences the DIMM2 260 as the ISI. Also, In the DIMM1 230 in which the ODT resistors are in an "ON" state, since the ODT resistors 241 and 242 of the DRAM1 240 which is one of the two chips are in the "ON" state, the reflected wave is generated from the DRAM2 250 including the ODT resistors which are in the "OFF" state.

Thus, a multi-drop bus having a new structure which can reduce the generation of the reflected wave and increase the operation speed up to 3 Gb/s by improving the bus structure used in the DDR-II memory system is demanded.

SUMMARY OF THE INVENTION

To solve the above and/or other problems, the present invention provides a memory system having a multi-drop bus structure having multiple termination resistors.

The present invention provides a memory module employing a multi-drop method.

According to an aspect of the present invention, a memory system having a multi-drop bus structure comprises one or more buses, a connector connected to a bus line, and a memory module connected to the connector and having at least one memory chip and a termination resistor in the memory chip, wherein a property impedance of a wire to which the memory chip is connected has a first impedance value.

The memory system further comprises a memory controller in which a port connected to the bus is terminated by a resistor having a second impedance value. The first impedance value is twice the second impedance value.

According to another aspect of the present invention, a memory system having a multi-drop bus structure comprises a bus, a memory controller in which a port connected to the bus is terminated by a resistor having a first impedance value, a connector connected to a point having the first impedance value from the memory controller on a bus line, and a memory module connected to the connector. The memory module comprises a first load connected to the connector and having the first impedance value, a second load connected to the first load and having a second impedance value, a first chip in which a port connected to the second load is terminated by a resistor having the second impedance value, a via hole penetrating a printed circuit board of the memory module between the first load and the second load, a third load connected to the via hole and having the second impedance value, and a second chip in which a port connected to the third load is terminated by a resistor having the second impedance value. The first load, the second load, and a first chip are formed on a first surface of the memory module while the third load and the second chip are formed on a second surface thereof. The first impedance value is twice the second impedance value.

According to another aspect of the present invention, a memory module comprises a first load connected to a memory module electrode and having a first impedance value, a second load connected to the first load and having a second impedance value, a first chip in which a port connected to the second load is terminated by a resistor having the second impedance value, a via hole penetrating a printed circuit board of the memory module between the first load and the second load, a third load connected to the via hole and having the second impedance value, and a second chip in which a port connected to the third load is terminated by a resistor having the second impedance value. The first load, the second load, and a first chip are formed on a first surface of the memory module while the third load and the second chip are formed on a second surface thereof. The first impedance value is twice the second impedance value.

BRIEF DESCRIPTION OF THE DRAWINGS

The above and other features and advantages of the present invention will become more apparent by describing in detail preferred embodiments thereof with reference to the attached drawings in which:

FIG. 3 is a table showing a method of controlling ODT resistors in the DDR-II memory system of FIG. 2;

DETAILED DESCRIPTION OF THE INVENTION

Figure 1:
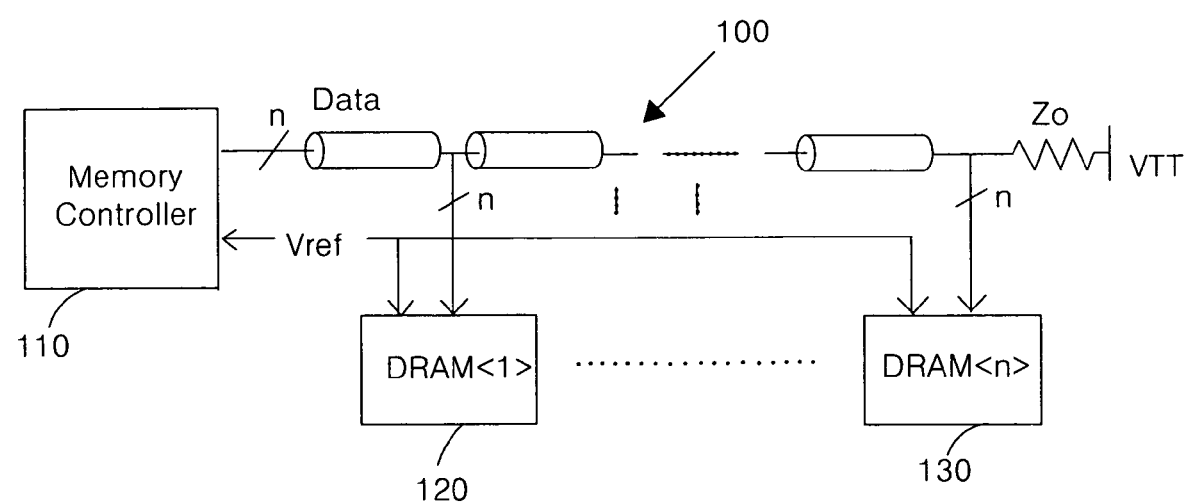
FIG. 1 is a view illustrating a signal line in a multi-drop method in a memory system.

In the accompanying drawings, the same reference numerals denote the same constituent elements having the same functions.

Figure 4:
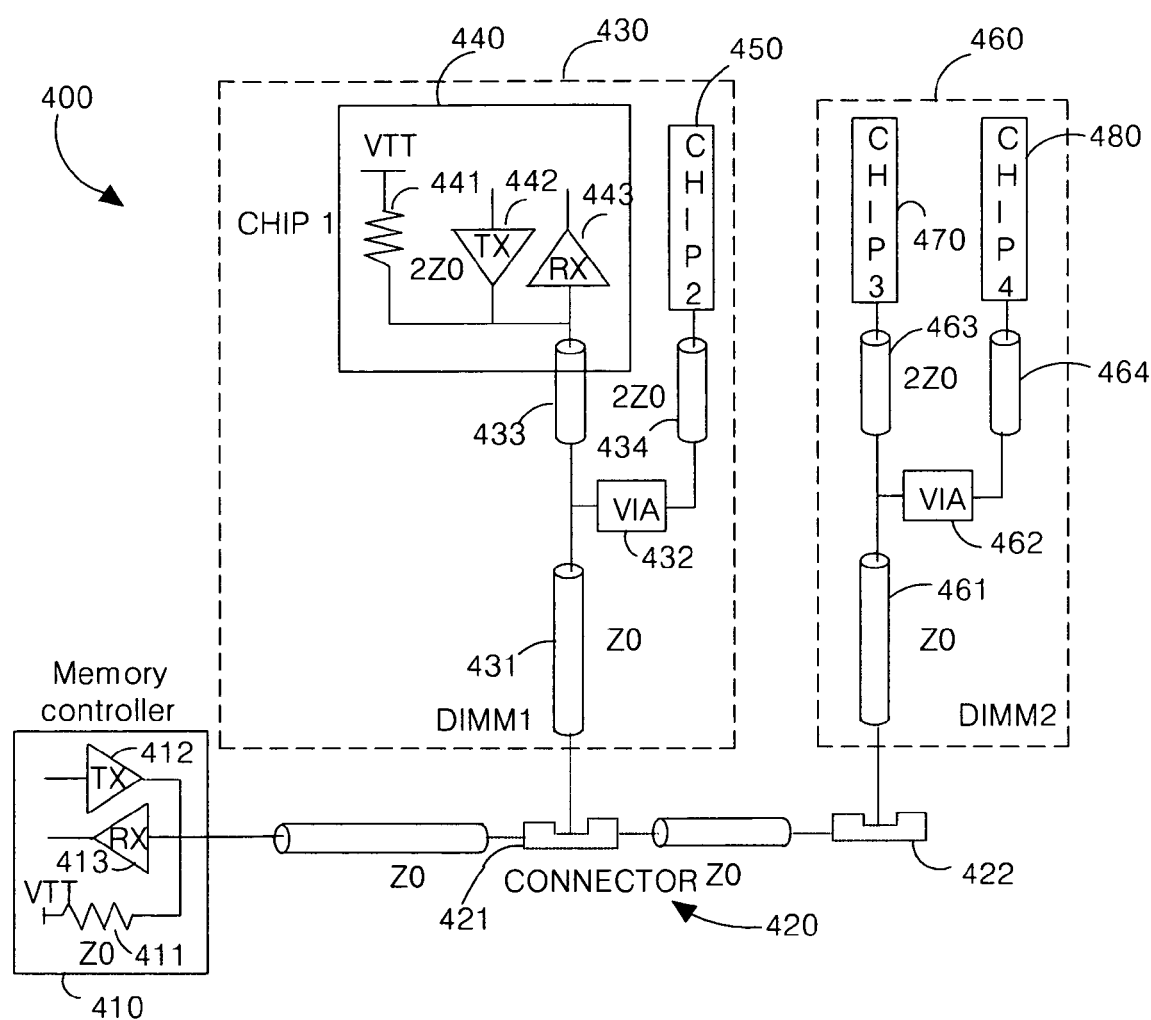
FIG. 4 is a view illustrating a memory system having a multi-drop bus structure according to an embodiment of the present invention.

FIG. 4 is a view illustrating a memory system having a multi-drop bus structure according to an embodiment of the present invention. Referring to FIG. 4, a memory system 400 includes four chips, for example, DRAM chips 440, 450, 470, and 480 which are connected to a single bus line 420 in a multi-drop bus structure. A memory controller 410 and first and second memory modules 430 and 460 are connected via first and second connectors 421 and 422 in the bus line 420. The first chip 450 and the second chip 460 are installed in the first memory module 430 while the third chip 470 and the fourth chip 480 are installed in the second memory module 460. A bus line load between the memory controller 410 and the first connector 421 is assumed to be a first impedance Z0 and a bus line load between the first connector 421 and the second connector 422 is identically assumed to be a first impedance Z0.

In the memory controller 410, a transmitting portion 412, a receiving portion 413, and a first on-die termination (ODT) resistor 411 are connected to a single input/output (I/O) port. The first ODT resistor 411 has the first impedance Z0 between a termination voltage VTT and the I/O port.

The first memory module 430 includes, on the front side thereof, a first load 431 connected to the first connector 421, a second load 433 connected to the first load 431, and the first chip 440 connected to the second load 433. On the rear side of the first memory module 430, a third load 434 is connected to a via hole 432 which penetrates a printed circuit board of the first memory module 430 and is connected between the first and second loads 431 and 433, and the second chip 450 is connected to the third load 434. The via hole 432 is filled with a metal exhibiting a high conductivity.

The first load 431 has the first impedance Z0 while the second and third loads 433 and 434 have a second impedance 2Z0. The second impedance 2Z0 is set to be twice the first impedance Z0. The first chip 440 has an I/O port connected to the second load 433 and a transmitting portion 442, a receiving portion 443, and a second ODT resistor 441 are connected to the I/O port. The second ODT resistor 441 has the second impedance 2Z0. The second chip 450 has the same structure as that of the first chip 440.

Like the first memory module 460, the second memory module 460 includes, on the front side thereof, a fourth load 461 connected to the second connector 422, a fifth load 463 connected to the fourth load 461, and the third chip 470 connected to the fifth load 463. On the rear side of the second memory module 460, a sixth load 464 is connected to a via hole 462 which penetrates a printed circuit board of the second memory module 460 and is connected between the fourth and fifth loads 461 and 463, and the fourth chip 480 is connected to the sixth load 464. The via hole 462 is filled with a metal exhibiting a high conductivity. The third and fourth chips 470 and 480 have the same configuration as the first chip 440. The fourth load 461 has the first impedance Z0 while the fifth and sixth loads 463 and 464 have the second impedance 2Z0.

Figure 2:
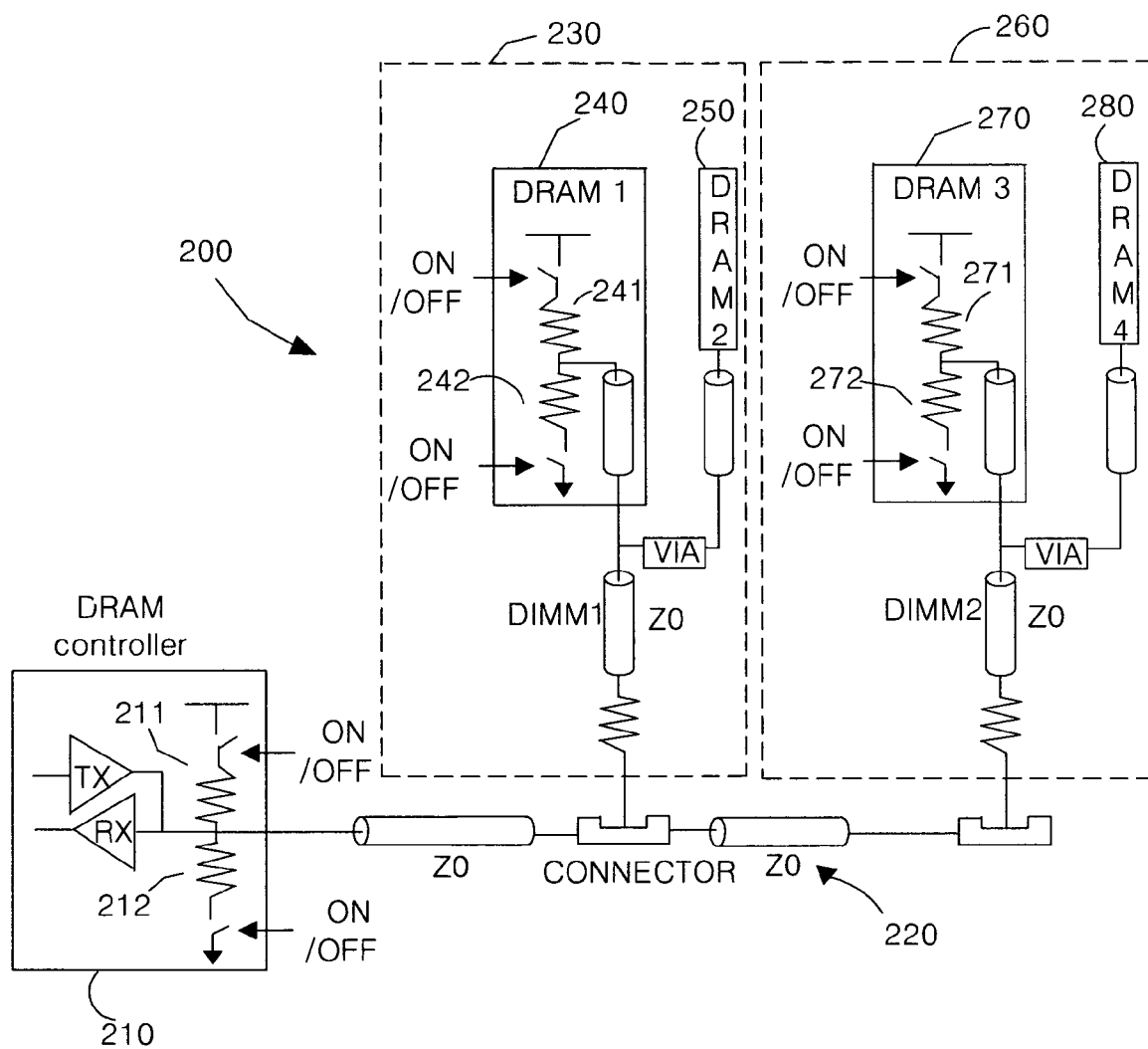
FIG. 2 is a view illustrating a configuration of a conventional bus used for a DDR-II memory system.

In the memory system 400 configured as above, the first and second ODT resistors 411 and 441 are present in all of the chips 410, 440, 450, 470, and 480 and always operate. For example, the second ODT resistor 441 used for the memory system 400 configured with DDR-II DRAM chips is operated in only one of the four DRAM chips 440, 450, 470, and 480. A single reflected wave is generated at a T-shaped connection portion such as the connectors 421 and 422 and the via holes 432 and 462. However, on arriving at each of the DRAM chips 440, 450, 470, and 480, the reflected wave disappears without generating multiple reflected waves because the second ODT resistor 441 is terminated. Thus, the preservation of a signal of a channel is improved compared to the conventional DDR-II memory system 200 shown in FIG. 2.

Figure 5:
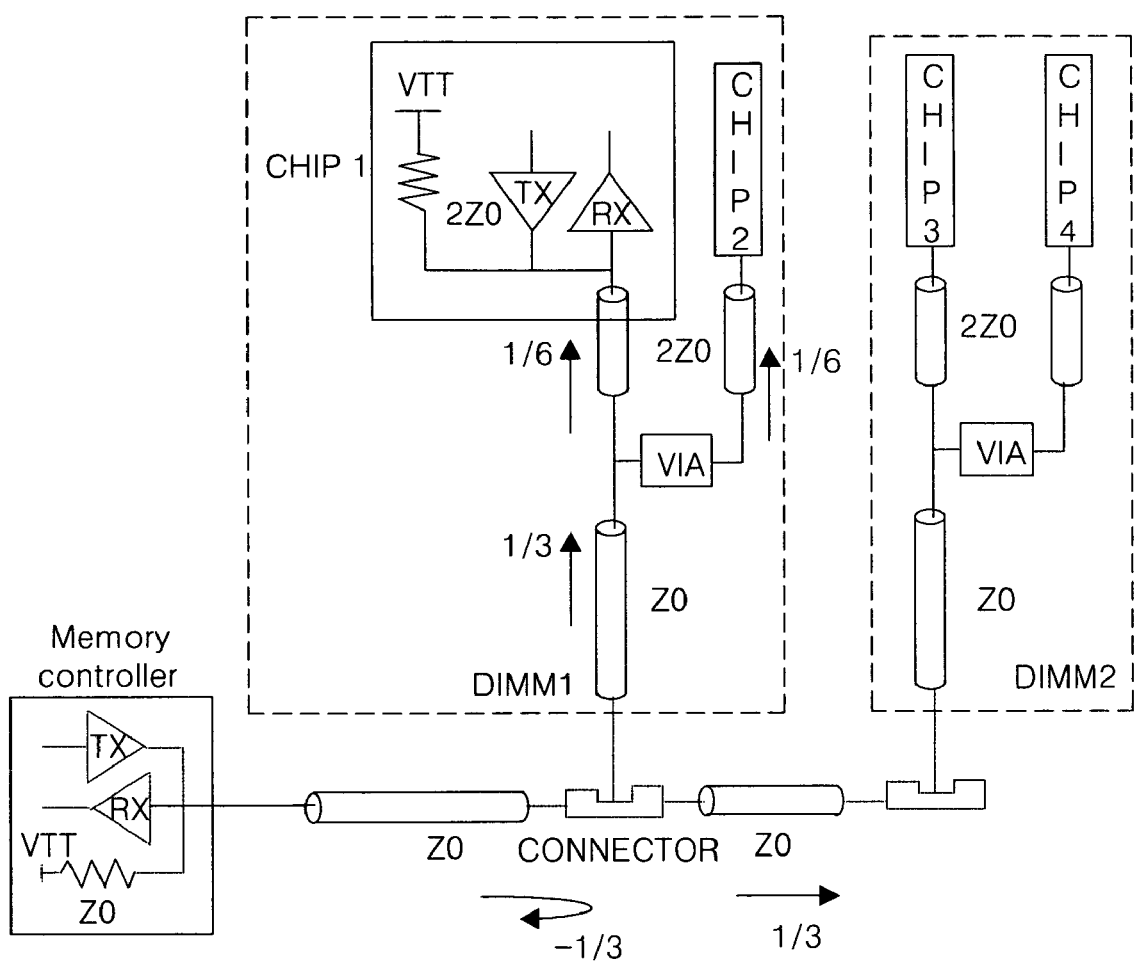
FIG. 5 is a view illustrating the transmission of a signal on a bus line during a write operation in the memory system of FIG. 4.

FIG. 5 is a view illustrating the transmission of a signal on a bus line during a write operation in the memory system 400 of FIG. 4. Referring to FIG. 5, when a signal is transmitted from the transmitting portion 412 of the memory controller 410, a reflected wave is first generated from the first connector 421 connected to the first memory module 430. Assuming that the amount of the signal transmitted from the transmitting portion 412 of the memory controller 410 is 1, a signal reflected back to the memory controller 410 has an amount of −⅓. The reflected signal is removed by the first ODT resistor 411 of the memory controller 410.

The signal transmitted to the first memory module 430 has an amount of ⅓. The signal is transmitted to the first and second chips 440 and 450 by being divided by the via hole 432 of the first memory module to have an amount of ⅙ each. In this case, a property impedance viewed from the via hole 432 has the first impedance Z0 which matches the first impedance Z0 of the first load 431 so that a reflected wave is not generated. A signal transmitted to the second memory module 460 does not generate a reflected wave for the same reason. Thus, during a write operation, the reflected wave generated from the first connector 421 connected to the first memory module 430 does not work as signal interference ISI. The signals finally transmitted to the DRAM chips 440, 450, 470, and 480 have an amount of ⅙ each.

Figure 6:
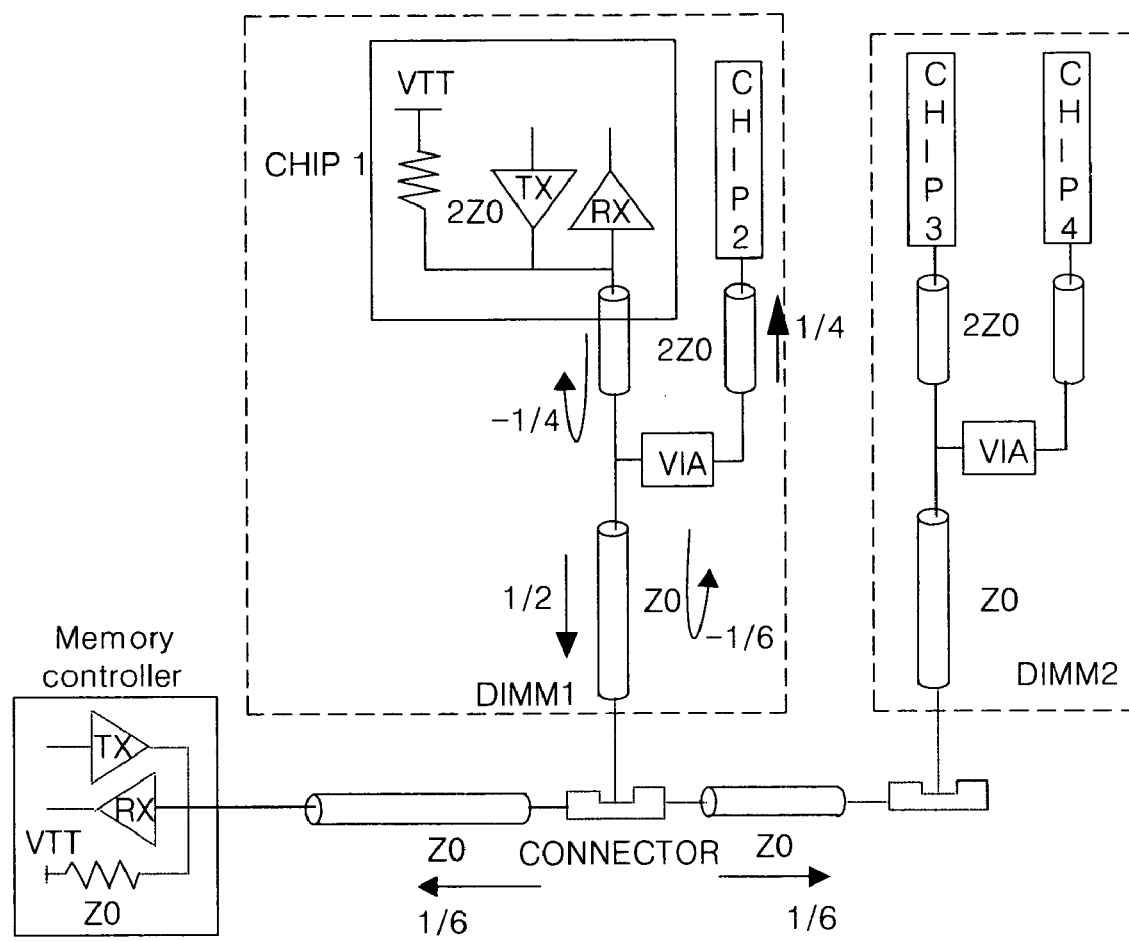
FIG. 6 is a view illustrating the transmission of a signal on a bus line during a read operation in the memory system of FIG. 4.

FIG. 6 is a view illustrating the transmission of a signal on a bus line during a read operation in the memory system 400 of FIG. 4. Referring to FIG. 6, for example, when a signal is transmitted from the first chip 440 to the memory controller 410, a reflected wave is first generated from the via hole 432 of the first memory module 430. When the amount of the signal transmitted from the first chip 440 is assumed to be 1, a signal reflected back to the first chip 440 has an amount of −¼. The reflected signal is removed by the second ODT resistor 441 of the first chip 440.

A signal transmitted to the first load 431 after passing through the via hole 432 of the first memory module 430 has an amount of ½. The signal generates a second reflection at the first connector 421 to which the first memory module 430 is connected. That is, a reflected wave having an amount of −⅙ is generated and proceeds toward the first memory module 430, but the reflected wave is removed by the second ODT resistor 441 of the first chip 440. Signals each having an amount of ⅙ are transmitted to the memory controller 410 and the second memory module 460 via the first connector 421. Since the signals transmitted to the second memory module 460 are terminated by the third and fourth chips 470 and 480, a reflected wave is not generated. Also, the signal transmitted to the memory controller 410 does not generate a reflected wave.

Thus, during the read operation, the reflected wave generated from the first connecter 421 connected to the first memory module 430 does not work as the ISI. Since the signal finally transmitted to the memory controller 410 has an amount of ⅙, the same signal transmission width as in the write operation is maintained.

In the memory system 400 having a multi-drop bus structure according to the present invention, when a DRAM is adopted for the first through fourth chips 440, 450, 470, and 480, a current mode transmission circuit can be used to maintain the same signal transmission width during both write and read operations.

Figure 7:
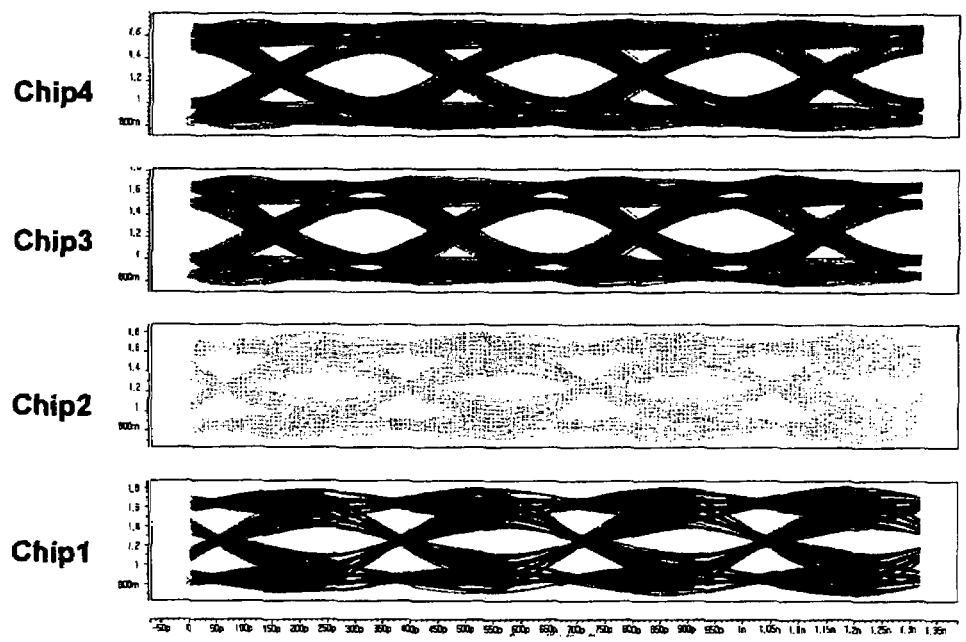
FIG. 7 is an image showing a result of a simulation of an eye pattern of a signal in each of chips when data is transmitted at a speed of 3 Gb/s during a write operation of a DRAM.

FIG. 7 is an image showing a result of a simulation of an eye pattern of a signal in the respective chips 440, 450, 470, and 480 when data is transmitted at a speed of 3 Gb/s during a write operation of a DRAM. Although in the conventional DDR-II memory system 200 of FIG. 2 data cannot be determined because an eye of a signal is closed at a transmission speed of 1 Gb/s or more, in the memory system bus according to the present invention, the eye is open such that data can be determined at a speed of 3 Gb/s.

Figure 8:
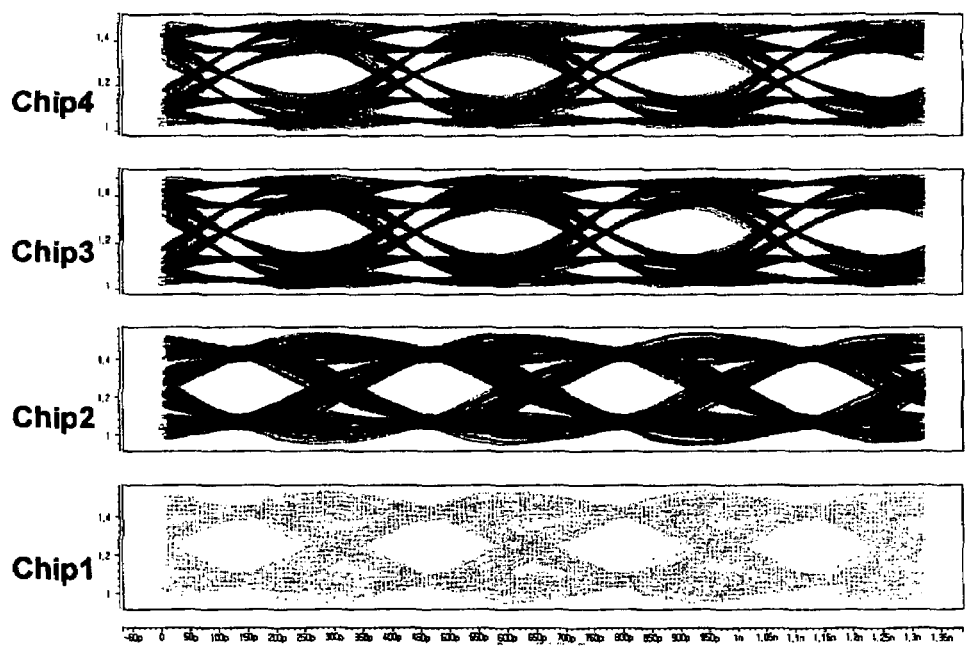
FIG. 8 is an image showing a result of a simulation of an eye pattern of a signal in each of chips when data is transmitted at a speed of 3 Gb/s during a read operation of a DRAM.

FIG. 8 is an image showing a result of a simulation of an eye pattern of a signal in the memory controller 410 when data is transmitted in the respective chips 440, 450, 470, and 480 at a speed of 3 Gb/s during a read operation of a DRAM. Referring to FIG. 8, the eye of a signal is open such that the signal can be determined.

While this invention has been particularly shown and described with reference to preferred embodiments thereof, it will be understood by those skilled in the art that various changes in form and details may be made therein without departing from the spirit and scope of the invention as defined by the appended claims.

As described above, according to the present invention, a reflected wave is reduced and preservation of a signal of a channel is improved by adopting a multi-drop bus structure in a DDR-II memory system. Also, a high speed operation of the DDR-II memory system is possible. Since the multi-drop bus structure is similar to the conventional DRAM bus structure, the DDR-II memory system according to the present invention can be easily used and operated regardless of the number of the chips.

The present invention is a multi-drop bus having multiple termination resistors which increases a data transmission speed by reducing the ISI occurring at the reflected wave on a multi-drop bus. Although a single reflected wave is generated at a portion where the T-shaped connection portion such as the connector or the via hole in the bus according to the present invention exists, when the reflected wave arrives at each chip, since the chip is terminated, multiple reflected waves are not generated, but disappear. Thus, since the preservation of a signal is improved as the reflected wave generated from the conventional DDR-II DRAM bus, the present invention can be used as a high speed multi-drop channel. Furthermore, since the memory system according to the present invention has the same structure as the conventional DRAM bus method, it can be easily used and operated regardless of the number of the chips.

What is claimed is:

1. A memory system having a multi-drop bus structure comprising:
   a bus line;
   a connector connected to a bus line;
   a memory controller in which a port connected to the bus line is terminated by a resistor having a second impedance value; and
   a memory module connected to the connector and having at least one memory chip and a termination resistor in the memory chip,
   wherein the memory module comprises:
   a first load connected to the connector;
   a second load connected to the first load and having a first impedance value;
   a first chip in which a port connected to the second load is terminated by a resistor having the first impedance value;
   a via hole penetrating a printed circuit board of the memory module between the first load and the second load;
   a third load connected to the via hole and having the first impedance value; and a second chip in which a port connected to the second load is terminated by a resistor having the first impedance value, wherein the first load, the second load, and the first chip are formed on a first surface of the memory module while the third load and the second chip are formed on a second surface thereof, and a property impedance of a wire to which the memory chip is connected has the first impedance value.

2. The memory system of claim 1, wherein the second impedance value is twice the first impedance value.

3. The memory system of claim 2, wherein the first load has an impedance value corresponding to half of the first impedance value.

4. A memory system having, a multi-drop bus structure comprising:
   a bus line;
   a memory controller in which a port connected to the bus is terminated by a resistor having a first impedance value;
   a connector connected to a point having the first impedance value from the memory controller on a bus line; and
   a memory module connected to the connector, the memory module comprising:
      a first load connected to the connector and having the first impedance value;
      a second load connected to the first load and having a second impedance value;
      a first chip in which a port connected to the second load is terminated by a resistor having the second impedance value;
      a via hole penetrating a printed circuit board of the memory module between the first load and the second load;
      a third load connected to the via hole and having the second impedance value; and
      a second chip in which a port connected to the third load is terminated by a resistor having the second impedance value,
   wherein the first load, the second load, and the first chip are formed on a first surface of the memory module while the third load and the second chip are formed on a second surface thereof.

5. The memory system of claim 4, wherein the second impedance value is twice the first impedance value.

6. A memory module comprises:
   a first load connected to a memory module electrode and having a first impedance value;
   a second load connected to the first load and having a second impedance value;
   a first chip in which a port connected to the second load is terminated by a resistor having the second impedance value;
   a via hole penetrating a printed circuit board of the memory module between the first load and the second load;
   a third load connected to the via hole and having the second impedance value; and
   a second chip in which a port connected to the third load is terminated by a resistor having the second impedance value,
   wherein the first load, the second load, and the first chip are formed on a first surface of the memory module while the third load and the second chip are formed on a second surface thereof.

7. The memory module of claim 6, wherein the second impedance value is twice the first impedance value.

* * * * *